United States Patent
Wang et al.

(10) Patent No.: US 10,670,958 B2
(45) Date of Patent: Jun. 2, 2020

(54) METHOD FOR FORMING A LAYOUT PATTERN

(71) Applicants: UNITED MICROELECTRONICS CORP., Hsin-Chu (TW); Fujian Jinhua Integrated Circuit Co., Ltd., Quanzhou, Fujian Province (CN)

(72) Inventors: Ying-Chiao Wang, Changhua County (TW); Yu-Cheng Tung, Kaohsiung (TW); Li-Wei Feng, Kaohsiung (TW); Chien-Ting Ho, Taichung (TW)

(73) Assignees: UNITED MICROELECTRONICS CORP., Hsin-Chu (TW); Fujian Jinhua Integrated Circuit Co., Ltd., Quanzhou, Fujian Province (CN)

( * ) Notice: Subject to any disclaimer, the term of this patent is extended or adjusted under 35 U.S.C. 154(b) by 254 days.

(21) Appl. No.: 15/937,825

(22) Filed: Mar. 27, 2018

(65) Prior Publication Data

US 2018/0335703 A1 Nov. 22, 2018

(30) Foreign Application Priority Data

May 22, 2017 (CN) .......................... 2017 1 0363149

(51) Int. Cl.
*G03F 1/36* (2012.01)
*G03F 7/20* (2006.01)
*H01L 27/108* (2006.01)

(52) U.S. Cl.
CPC ................ *G03F 1/36* (2013.01); *G03F 7/705* (2013.01); *G03F 7/70441* (2013.01); *H01L 27/10844* (2013.01)

(58) Field of Classification Search
CPC ......... G03F 1/36; G03F 7/70441; G03F 7/705
USPC ..................................... 430/5, 30
See application file for complete search history.

(56) References Cited

U.S. PATENT DOCUMENTS

| | | | |
|---|---|---|---|
| 6,022,644 A | 2/2000 | Lin |
| 6,673,638 B1 | 1/2004 | Bendik |
| 6,887,625 B2 | 5/2005 | Baselmans |
| 6,905,899 B2 | 6/2005 | Yang |
| 7,259,065 B2 | 8/2007 | Goo |
| 8,003,539 B2 | 8/2011 | Zia |

*Primary Examiner* — Christopher G Young
(74) *Attorney, Agent, or Firm* — Winston Hsu

(57) ABSTRACT

A method of forming a layout pattern is disclosed. First, an array comprising a plurality of main features is provided wherein the main features are arranged into a plurality of rows along a first direction and are parallel and staggered along a second direction. Assistant features are inserted into each row of the main features. A shortest distance d1 between the main features in row n to the main features in row n+1 and a shortest distance d2 between the main feature in row n−1 to the main feature in row n+1 are obtained. The assistance features inserted in row n of the main features are then adjusted according to the difference between the distances d1 and d2. After that, the main features and the assistant features are output to a photo mask.

20 Claims, 7 Drawing Sheets

METHOD FOR FORMING A LAYOUT PATTERN

BACKGROUND OF THE INVENTION

1. Field of the Invention

The present invention generally relates to a method for forming a layout pattern, and more particularly, to a method for forming a layout pattern having assistant features for preventing corner rounding problems.

2. Description of the Prior Art

In semiconductor manufacturing process, in order to transfer a circuit layout pattern onto a semiconductor wafer, the circuit layout is transferred to a photo mask to form a photo mask pattern. By performing a photolithography process, the photo mask pattern is proportionally transferred to a photoresist layer covering on the semiconductor wafer thereby producing a photoresist pattern. The photoresist pattern is then transferred to the semiconductor wafer by performing an etching process using the photoresist as an etching mask.

During the photolithography process to produce the photoresist pattern from the photo mask pattern, the size and shape of the photoresist pattern may be different from the photo mask pattern due to an optical proximity effect (OPE). For example, common pattern distortions due to optical proximity effect include corner rounding, line end shorting and line width increasing or decreasing. With the increasing miniaturization of semiconductor devices and higher degree of integration, the optical proximity effect has become more significant and may cause degradation in performance and yield loss.

A method widely adopted in the field to eliminate the optical proximity effect is optical proximity correction (OPC). After the tape-out stage of an integrated circuit, the circuit layout pattern is provided to a computer system for performing correction before being transferred to a photo mask. The correction is based on specialized rules established according to the manufacturing process applied to producing the integrated circuit. More particularly, the correction is to compensate for the optical proximity effect by, for example, adjusting the line widths, modifying line ends into hammer-heads, adding notches or flaps to the turning corners, or inserting sub-resolution assistant features (SRAF) or dummy features for adjusting overall or regional pattern densities. Afterward, the corrected circuit layout pattern may be revised again to make sure no violations against process rules are generated, the corrected circuit layout pattern is then output from the computer system and transferred to a photo mask to form a photo mask pattern.

In the optical proximity correction for dense array patterns, uniformity and symmetry of pattern density around each main feature (pattern desired to be transferred to the semiconductor substrate) are usually considered as most important principles. For example, as shown in FIG. 1, the assistant features 14 are selectively inserted into the vacancies between the main features 12 to make the main features 12 respectively have a uniform and symmetric surrounding, thereby the main features 12 may be transferred to the photoresist layer in a uniform shape and size. However, the problem of corner rounding of the main features 12 remains unsolved. As the integrated circuits are designed in higher integrity and smaller size, even corner rounding of critical patterns may cause serious impact on device performance. In another optical proximity correction for dense array patterns, as shown in FIG. 2, corners of the main features 22 are modified with flaps or subsidiary patterns 24 for preventing corner rounding problems. However, as the main features 22 continue to shrink in size, the subsidiary patterns 24 would lose their function for preventing corner rounding but adversely cause unexpected enlargement in size when transferring the main feature 22 to a semiconductor substrate. In light of the above, there is still a need in the field to provide a method for forming a pattern which is able to prevent corner rounding problems and producing features patterns in better fidelity.

SUMMARY OF THE INVENTION

One objective of the present invention is to provide a method of forming a layout pattern. By inserting assistant features into the array of main features and further adjusting the assistant features based on the corner-to-corner distances between adjacent main features, the corner rounding problem may be avoided and the main features may be transferred to the semiconductor substrate in better fidelity.

To achieve the objective, one embodiment of the present invention provides a method of forming a layout pattern including the following steps. First, an array pattern including a plurality of main features is provided. The main features are arranged at a same interval along a first direction to form a plurality of rows, and the main features in row n−1, row n and row n+1 are staggered along a second direction. Next, a plurality of assistant features are inserted into each row of the main features and alternating with the main features along the first direction. Subsequently, a shortest distance d1 between the main features in row n and the main features in row n+1 and a shortest distance d2 between the main features in row n−1 and the main features in row n+1 are obtained. Afterward, the assistant features inserted in row n of the main features are adjusted according to the difference between the shortest distance d1 and the shortest distance d2. After that, the main features and the assistant features are output to a photo mask.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute apart of this specification. The drawings illustrate some of the embodiments and, together with the description, serve to explain their principles. In the drawings.

Figure 1:
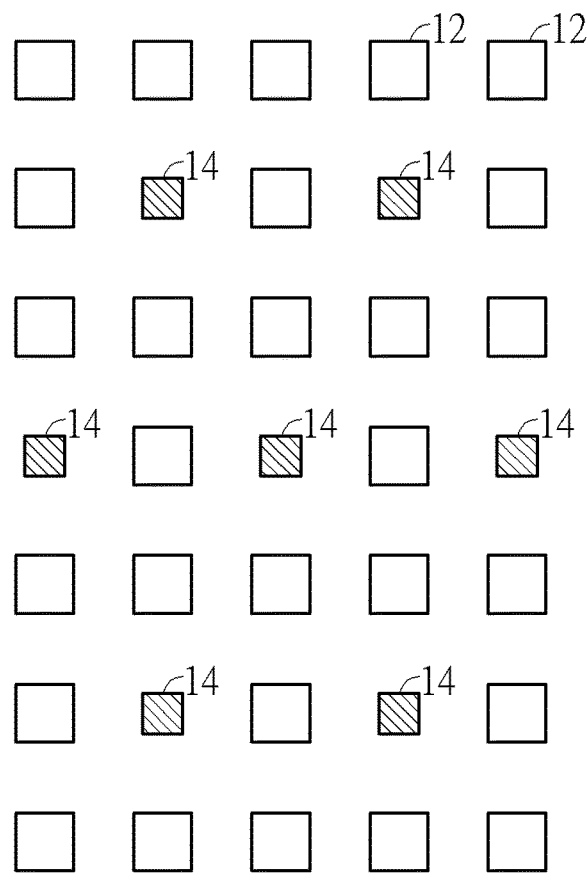
FIG. 1 shows a layout of a dense array pattern corrected by a conventional optical proximity correction (OPC).

It should be noted that all the figures are diagrammatic. Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

Figure 3:
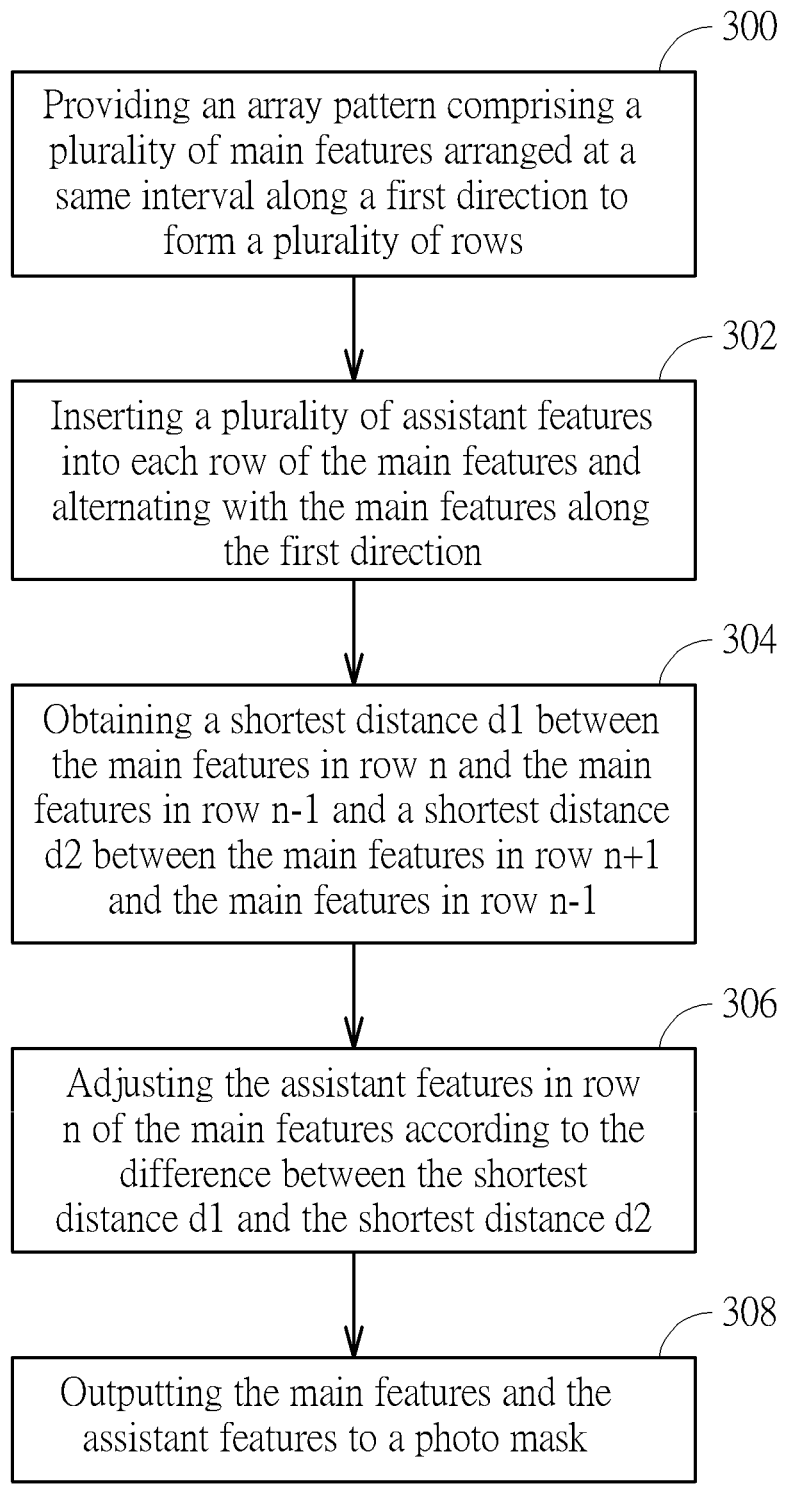
FIG. 3 is a flow chart illustrating a method of forming a layout pattern according to an embodiment of the present invention.
Figure 4:
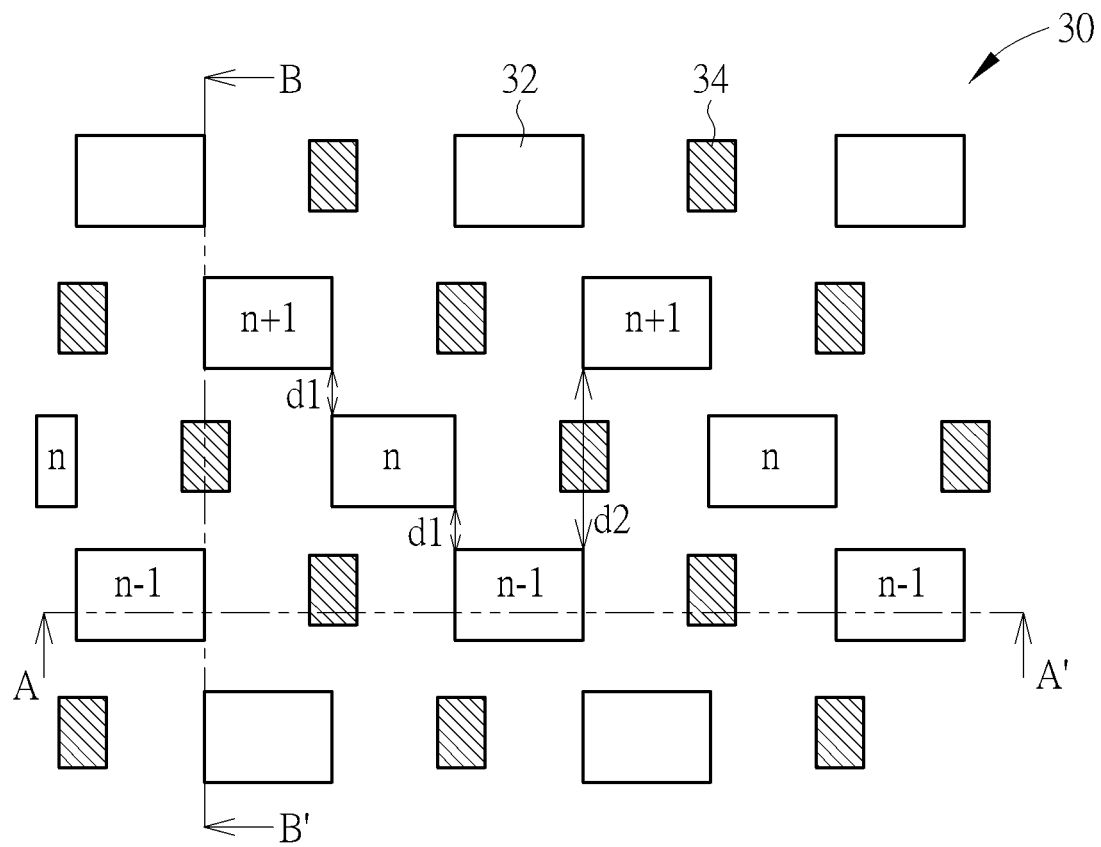
FIG. 4 and FIG. 5 are schematic diagrams showing the layout patterns formed by the method as shown in FIG. 3 according to some embodiment of the present invention.
Figure 5:
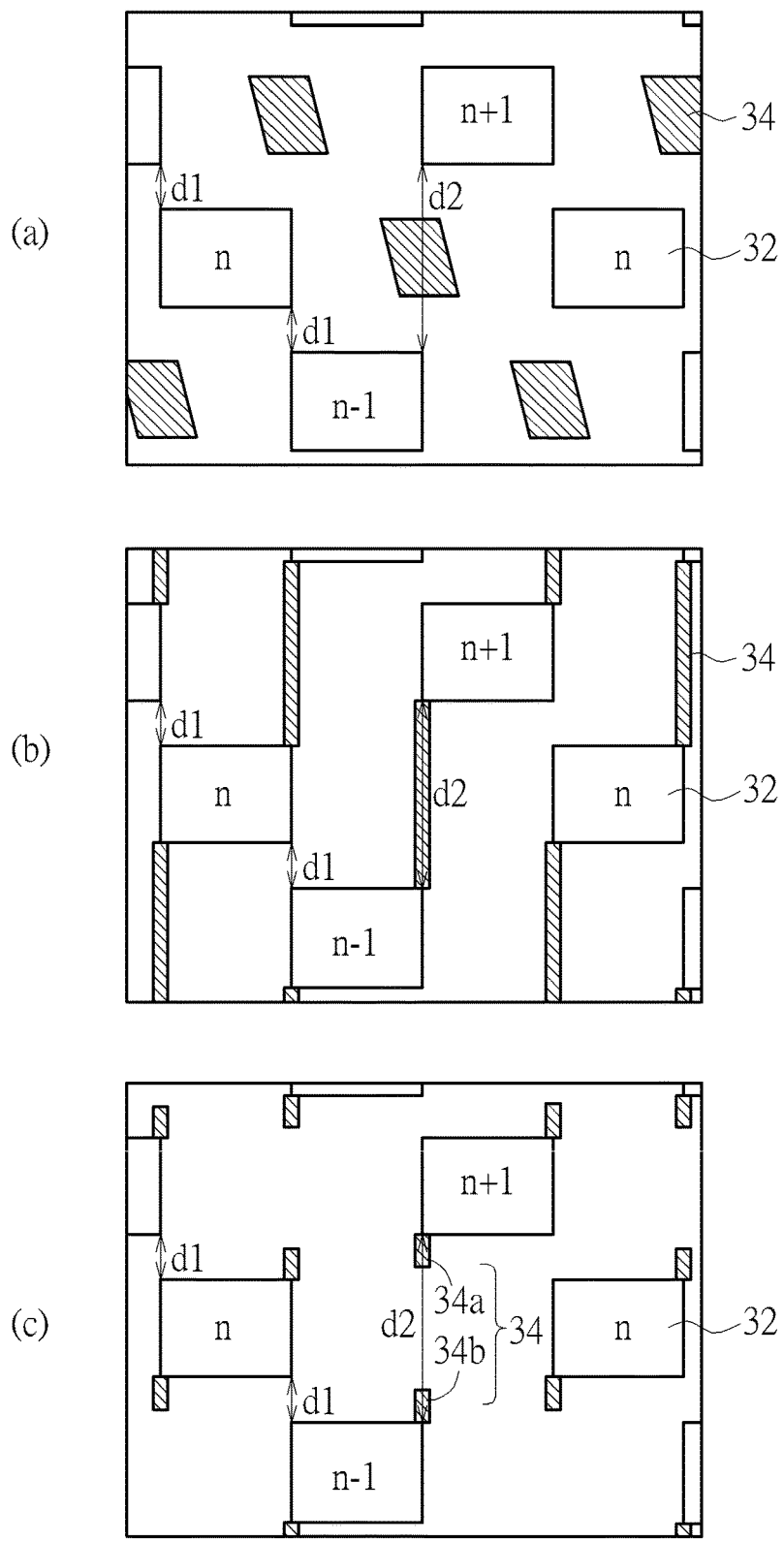

Please refer to FIG. 3 to FIG. 5. FIG. 3 is a flow chart illustrating a method of forming a layout pattern according to an embodiment of the present invention. FIG. 4 and FIG. 5 are schematic diagrams showing the layout patterns formed by the method as shown in FIG. 3.

First, step 300 is carried out to provide an array pattern 30 into a computer system for performing subsequent steps. More particularly, the computer system is able to perform optical proximity correction (OPC) on the array pattern 30. In some embodiments, the array pattern 30 is a designed pattern which is to be transferred to a semiconductor substrate to form a particular structural layer of an integrated circuit, such as active regions, gate regions or interconnecting structures. In other embodiments, the array pattern 30 may be transferred to a temporary material layer on the semiconductor substrate, such as a sacrificial layer or a photoresist layer for patterning another material layer or implantation process. The array pattern 30 may include a plurality of main features 32 arranged at a same interval along a first direction (the extending direction of line A-A') to form a plurality of rows, and the main features 32 in different rows are parallel and staggered along a second direction (the extending direction of line B-B'). According to the embodiment, the main features 32 in row n−1, row n and row n+1 (every three successive adjacent rows along the second direction and n is an integer) are staggered and not overlapping with each other along the second direction. The term "not overlapping" means the main features 32 in row n−1, row n and row n+1 may have edges overlapped, aligned along the second direction, or completely not overlapping. Meanwhile, the main features 32 in the row n+1 and row n−2 (in every three rows) are completely overlapped with each other along the second direction. That is, in the array pattern 30, every three adjacent rows of main features 32 may be considered as a group and repeat along the second direction. According to an embodiment, the main features 32 in the adjacent rows n−1, n and n+1 (three successive rows along the direction of line B-B) may have edges aligned along the direction of line B-B. In the illustrated embodiment, the first direction (the extending direction of line A-A') and the second direction (the extending direction of line B-B') are perpendicular. In other embodiments, such as the embodiment shown in FIG. 7, the first direction and the second direction may have an included angle smaller than 90 degrees. The shape of the main features 32 shown in FIG. 4 and FIG. 5 are only for illustration and should not be taken in a limiting sense. In a preferred embodiment, each of the main features 32 at least has a pair of edges parallel with the first direction or the second direction. More preferably, each of the main features 32 has two opposite edges parallel with the first direction and the other two opposite edges parallel with the second direction. Consequently, when the first direction and the second direction are perpendicular, the main features 32 may have a shape of rectangle. On the other hand, when the first direction and the second direction are not perpendicular, the main features 32 may have a shape of parallelogram.

Afterward, step 302 is performed to insert a plurality of assistant features 34 into each row of main features 32 and alternating with the main features 32 along the first direction. The assistant features 34 in step 302 may have a preliminarily shape, size and position determined by the rules specified for the manufacturing process that is used to form the main features 32 on the semiconductor substrate. For example, the rules may include criteria of critical width, critical space and pattern density. It should be understood that the shape, dimension and location of the assistant features 34 shown in FIG. 4 and FIG. 5 are only for illustration and should not be taken in a limiting sense. By inserting the assistant features 34, the main features 32 may have closer pattern densities along the first direction and the second direction.

Subsequently, step 304 is performed to obtain a shortest distance d1 between the main features 32 in row n and in row n−1 (which is also the shortest distance between the main features 32 in row n and in row n+1) and a shortest distance d2 between the main features 32 in row n−1 and in row n+1. As previously mentioned, the main features 32 in row n−1, row n and row n+1 are staggered and not overlapping along the second direction; therefore the shortest distance d1 is substantially linear from a corner of the main feature 32 in row n to a closest corner of the main feature 32 in row n−1 (or in row n+1). Similarly, the shortest distance d2 is substantially linear from a corner of the main feature 32 in row n−1 to a closest corner of the main feature 32 in row n+1. In an embodiment in which the main features 32 in row n−1, row n and row n+1 have edges aligned along the second direction, the shortest distance d1 and the shortest distance d2 are parallel. In other embodiment in which the main features 32 in rows n−1, n and n+1 completely not overlap with each other and do not have edges aligned along the second direction, the shortest distance d1 and the shortest distance d2 are not parallel.

Following, step 306 is performed to adjust the assistant features 34 in row n of the main features 32 based on the difference between the shortest distance d1 and the shortest distance d2. At least one of the following geometric parameters such as shape, size and position of the assistant features 34 is adjusted during the step 306. Preferably, as shown in FIG. 4, after the step 306, the assistant features 34 are spaced apart from the main features 32 and respectively positioned in the middle of the shortest distance d2.

In FIG. 5, examples of how the assistant features 34 may be adjusted are provided. As shown in diagram (a) of FIG. 5, the assistant features 34 may be adjusted into a different shape and may have at least a pair of edges not parallel with the first direction or the second direction. The assistant features 34 shown in diagram (a) of FIG. 5 are also spaced apart from the main features 32 and positioned in the middle of the shortest distance d2. As shown in diagram (b) of FIG. 5, the assistant features 34 may be adjusted to extend along the shortest distance d2 until abutting the two corners of the main features 32. As shown in diagram (c) of FIG. 5, the assistant features 34 may be adjusted into a plurality of sub-assistant features 34a and 34b arranged at two ends of the shortest distance d2 and abutting the corners of the main features 32. Other geometric modification not shown in the drawings may also be made to the assistant features 34 in the step of 306.

Thereafter, step 308 is performed to output the main features 32 and the assistant features 34 (adjusted) to a photo mask and collectively form a photo mask pattern. The assistant features 34 of the photo mask pattern are preferably sub-resolution, which are able to compensate optical proximity effect and improve the fidelity of transferring the main features 32 from the photo mask to the semiconductor substrate without themselves being transferred to the semiconductor substrate. Although in some cases the assistant features 34 may be partially transferred to a photoresist layer during the exposure step, the pattern of the assistant features 34 would be removed during a subsequent developing step. Therefore, none of the assistant features 34 would finally be transferred to the semiconductor substrate. When the assistant features 34 are positioned in an isolation region of semiconductor substrate, the assistant features 34 may be transferred to the semiconductor substrate and form electrically floating structures not connecting to other conductive material.

As previously mentioned, as the main features 32 are designed in smaller size and arranged in higher density, the optical proximity effect may become more significant and cause pattern distortion, especially the corner rounding problem. By inserting the assistant features 34 into each row of the main features 32 and further adjusting the assistant features 34 based on the difference between the shortest distance d1 and the shortest distance d2 between different rows of the main features 32, the present invention may effectively prevent the corner rounding problem and obtain the main features 32 on the semiconductor substrate in better fidelity.

Figure 6:
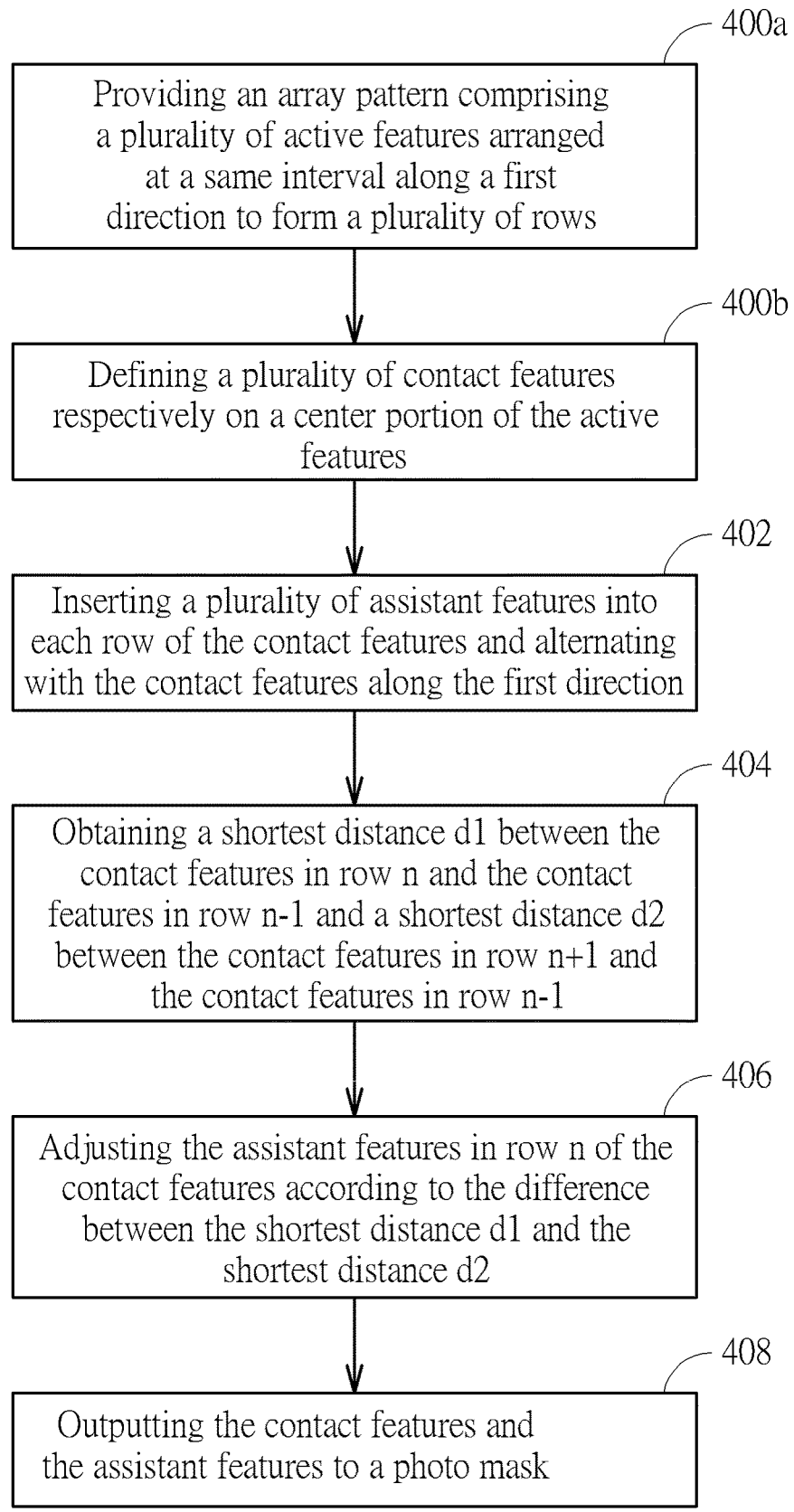
FIG. 6 is a flow chart illustrating a method of forming a layout pattern according to another embodiment of the present invention.
Figure 7:
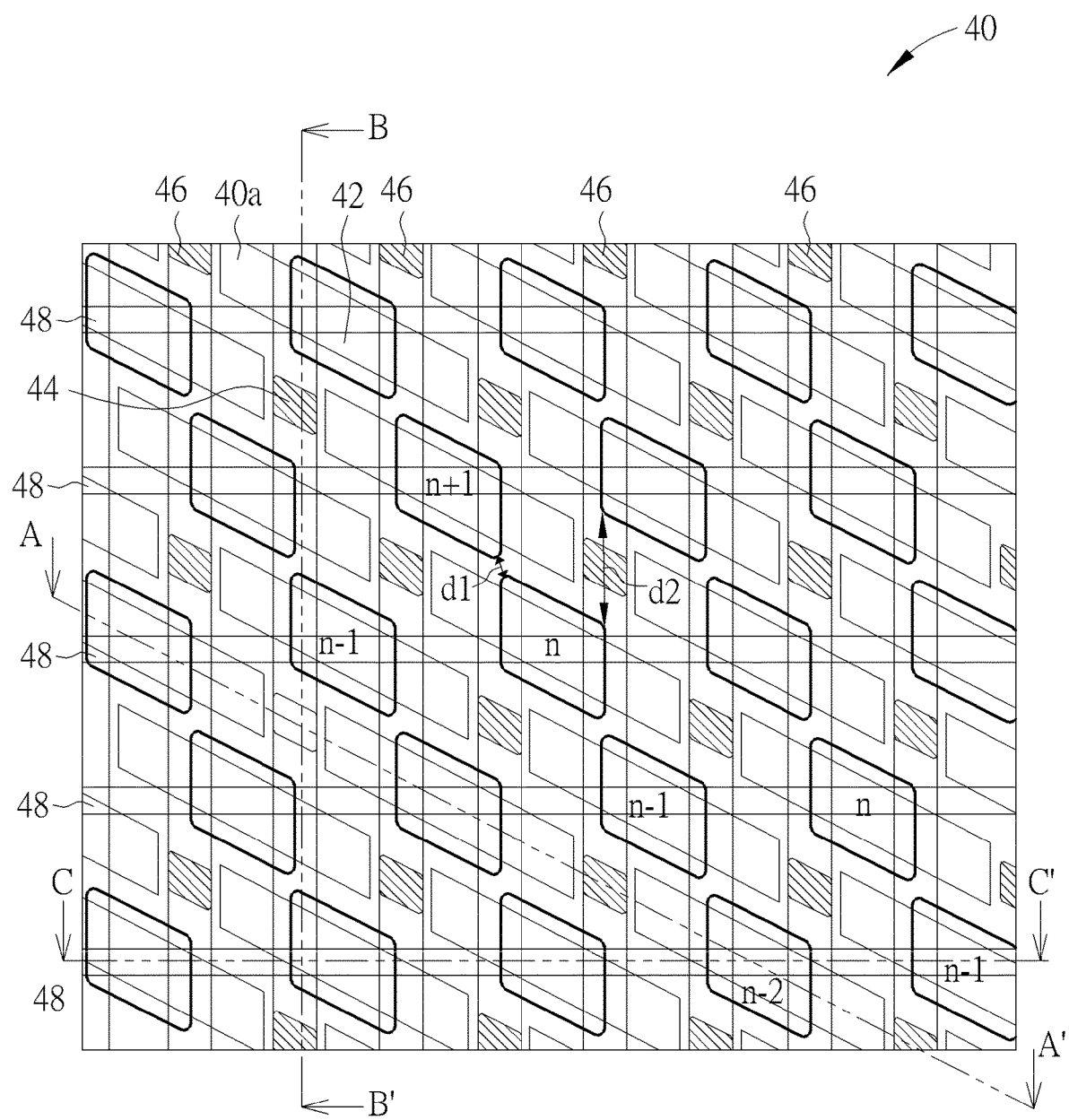
FIG. 7 and FIG. 8 are schematic diagrams showing the layout patterns formed by the method as shown in FIG. 6 according to some embodiment of the present invention.
Figure 8:
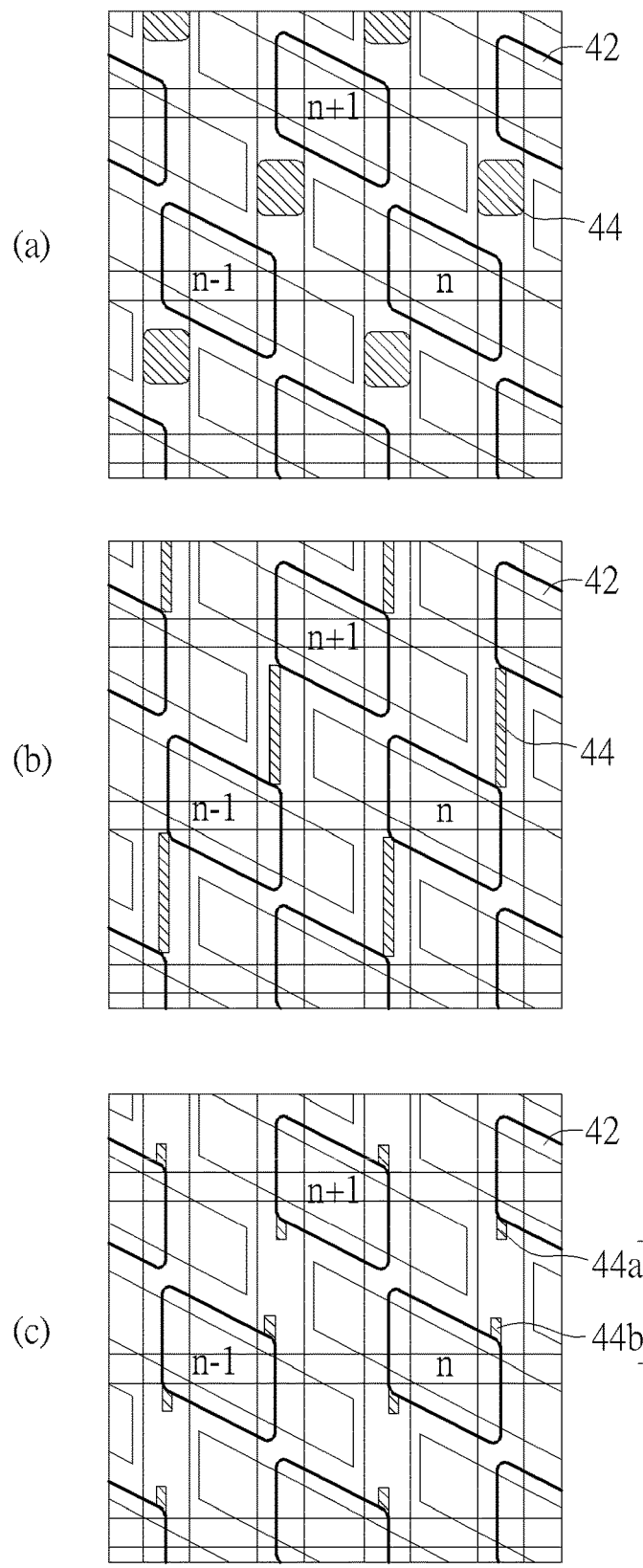

In the following description, another embodiment of the present invention is provided in which a layout pattern of a dynamic random access memory (DRAM) is formed by performing the method of the present invention. FIG. 6 is a flow chart illustrating a method of forming a layout pattern of a DRAM according to an embodiment of the present invention. FIG. 7 and FIG. 8 are schematic diagrams showing the layout patterns formed by the method as shown in FIG. 6.

First, step 400a is performed to provide an array pattern 40 into a computer system for performing subsequent steps. More particularly, the computer system is able to perform the optical proximity correction (OPC) to the array pattern 40. The array pattern 40 is of a DRAM device and may include multiple layout layers. For example, the array pattern 40 may include a layout layer defining the active features 40a, another layout layer defining the word lines 46, and another layout layer defining the bit lines 48. These layout layers would be respectively output to different photo masks used in different photolithography processes of manufacturing the DRAM device. According to the embodiment, the active features 40a extend lengthwise along a first direction (the extending direction of line A-A') and are arranged end-to-end in a same interval along the first direction to form a plurality of rows. Meanwhile, active features 40a in different rows are staggered along a second direction (the extending direction of line B-B'), and the active features 40a in every three successive adjacent rows, such as row n−1, row n and row n+1, are partially overlapped along the second direction. The active features 40a in row n+1 and row n−2 (or every three rows) are completely overlapped along the second direction. That is, every three adjacent rows of the active features 40a may be considered as a group and repeat along the second direction. According to the illustrated embodiment, the first direction and the second direction are not perpendicular and have an included angle smaller than 90 degrees, for example, between 70 and 75 degrees. The array pattern 40 further comprises a plurality of word lines 46 extending lengthwise along the second direction. The word lines 46 cut through the active features 40a and pass between adjacent terminals of active features 40a. The array pattern 40 further comprises a plurality of bit lines 48 extending lengthwise along a third direction (the extending direction of line C-C') which is perpendicular to the second direction. Each of the active features 40a is segmented into one middle portion and two side portions by two word lines 46 and is intersected with one of the bit lines 48 in the middle portion.

Next, step 400b is performed to define a plurality of contact features 42 in another layout layer of the array layout pattern 40. The contact features 42 are defined and arranged according to the arrangements of the active features 40a, the word lines 46 and the bit lines 48. More specifically, the contact features 42 are positioned respectively on the center portion of an active features 40a which is intersected (overlapped) by a bit line 48. Because the contact features 42 are defined according to the arrangement of the active features 40a, the contact features 42 are also arranged in a same interval along the first direction to form a plurality of rows, and contact features 42 in different rows are staggered along the second direction. It is noteworthy that contact features 42 in every three successive adjacent rows, such as row n−1, row n and row n+1, are staggered and not overlapped with each other along the second direction (may have edges aligned along the second direction or completely not overlapped). The contact features 42 in row n+1 and row n−2 (or in every three rows) are completely overlapped with each other along the second direction. The contact features 42 preferably have a shape of parallelogram, having two opposite edges parallel with the first direction and the other two opposite edges parallel with the second direction.

Afterward, step 402 is performed to insert a plurality of assistant features 44 (corresponding to the assistant features 34) into each row of the contact features 42 (corresponding to the main feature 32) and alternating with the contact features 42 along the first direction. The assistant features 34 may have a preliminarily shape, size and position determined by the rules specified for the manufacturing process that is used to form the contact features 42 on the semiconductor substrate. The shape, dimension and location of the assistant features 44 shown in FIG. 7 and FIG. 8 are only for illustration and should not be taken in a limiting sense. By inserting the assistant features 44, the contact features 42 may have closer pattern densities along the first direction and the second direction.

Subsequently, step 404 is performed to obtain a shortest distance d1 between the contact features 42 in row n and row n−1 (which is also the shortest distance between contact features 42 in row n and row n+1) and a shortest distance d2 between the contact features 42 in row n−1 and row n+1. As previously mentioned, the contact features 42 in row n−1, row n and row n+1 are staggered and not overlapping with each other along the second direction; therefore the shortest distance d1 is substantially linear from a corner of the contact features 42 in row n to a closest corner of the contact features 42 in row n−1 (or in row n+1). Similarly, the shortest distance d2 is substantially linear from a corner of the contact features 42 in row n−1 to a closest corner of the contact features 42 in row n+1. In the embodiment in which the main features 32 in row n−1, row n and row n+1 have edges aligned along the second direction, the shortest distance d1 and the shortest distance d2 are parallel with each other. In other embodiment in which the main features 32 in row n−1, row n and row n+1 completely not overlap with each other and do not have edges aligned along the second direction, the shortest distance d1 and the shortest distance d2 are not parallel.

Following, step 406 is performed to adjust the assistant features 44 in row n of the contact features 42 based on the difference between the shortest distance d1 and the shortest distance d2. At least one of the following geometric parameters such as shape, dimension and position of the assistant features 44 is adjusted during the step 406. Preferably, as shown in FIG. 7, after the step 406, the assistant features 44 are spaced apart from the contact features 42 and respectively positioned in the middle of the shortest distance d2. When overlapping with other layout layers, the assistant features 44 would be positioned between adjacent terminals of active features 40a and overlapping with the word lines 46.

FIG. 8 shows some examples of how the assistant features 44 may be adjusted. As shown in diagram (a) of FIG. 8, the assistant features 44 may be adjusted into a different shape and may have at least a pair of edges not parallel with the first direction or the second direction. The assistant features 44 shown in diagram (a) of FIG. 8 are also spaced apart from the contact features 42 and positioned in the middle of the shortest distance d2. As shown in diagram (b) of FIG. 8, the assistant features 44 may be adjusted to extend along the shortest distance d2 until abutting the two corners of the contact features 42. As shown in diagram (c) of FIG. 8, the assistant features 44 may be adjusted into a plurality of sub-assistant features 44a and 44b arranged at two ends of the shortest distance d2 and abutting the corners of the contact features 32. Other geometric modification not shown in the drawings may also be made to the assistant features 44 in the step of 406.

After adjusting the assistant features 44, step 408 is performed to output the contact features 42 and the assistant features 44 (adjusted) to a photo mask and collectively form a photo mask pattern. The photo mask comprising the photo mask pattern including the contact features 42 and the assistant features 44 (adjusted) is used in a photolithography process for forming the bit line contacts in the semiconductor substrate of the DRAM device. The assistant features 44 of the photo mask pattern are preferably sub-resolution and able to compensate optical proximity effect (OPE) and improve the fidelity of the resulting bit line contacts without themselves being transferred to the semiconductor substrate. In some embodiments when the word lines 46 are buried word lines buried in a dielectric layer, the assistant features 44 are allowed to be transferred to the semiconductor substrate and positioned on the dielectric layer over word lines 46 without concerning bridging to the word lines 46.

Figure 2:
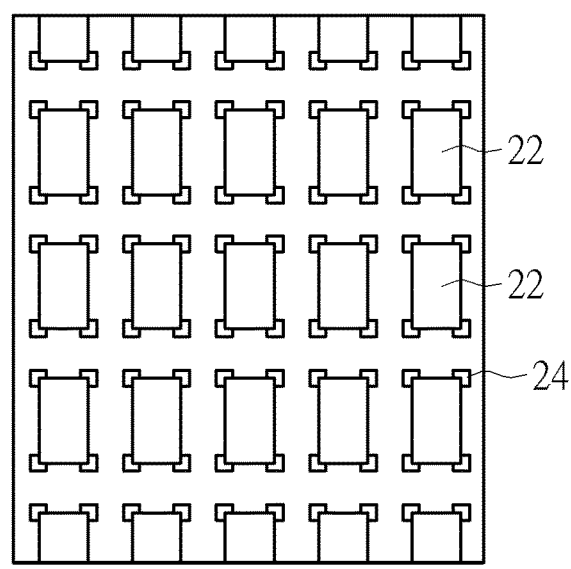
FIG. 2 shows a layout of a dense array pattern corrected by another conventional optical proximity correction (OPC).

In conventional method of applying optical proximity correction to a dense array pattern as shown in FIG. 1, the way of inserting assistant features is usually determined by pattern uniformity and symmetry around each main feature to form each main feature in the semiconductor substrate in a uniform shape, but the corner rounding problem still remains. In another conventional method of applying optical proximity correction to a dense array pattern to prevent corner rounding problems, as shown in FIG. 2, corners of each main feature are modified with flaps or subsidiary patterns. However, as the main features continue to shrink in size, the subsidiary patterns would adversely cause unexpected enlargement in size when transferring the main features to the semiconductor substrate. By inserting assistant features between the main features and further adjusting the assistant features based on different distances between the main features, especially the different corner-to-corner distances, the corner rounding problem may be effectively prevented and a better fidelity in the pattern transferring process may be achieved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for forming a layout pattern, comprising:
   providing an array pattern comprising a plurality of main features, wherein the main features are arranged at a same interval along a first direction to form a plurality of rows, and the main features in row n−1, row n and row n+1 are staggered along a second direction;
   inserting a plurality of assistant features into each row of the main features and alternating with the main features along the first direction;
   obtaining a shortest distance d1 between the main features in row n and the main features in row n+1 and a shortest distance d2 between the main features in row n−1 and the main features in row n+1;
   adjusting the assistant features in row n of the main features according to the difference between the shortest distance d1 and the shortest distance d2; and
   outputting the main features and the assistant features to a photo mask.

2. The method according to claim 1, wherein the first direction and the second direction have an included angle between 70 and 75 degrees.

3. The method according to claim 1, wherein the main features in the row n−1, row n and row n+1 are not overlapped along the second direction.

4. The method according to claim 1, wherein the main features are parallelogram-shaped, having a pair of edges parallel with the first direction and the other pair of edges parallel with the second direction.

5. The method according to claim 1, wherein each of the assistant features in row n of the main features is on the shortest distance d2 between the main features in row n−1 and the main features in row n+1.

6. The method according to claim 1, wherein the step of adjusting the assistant features includes adjusting at least one of the parameters of the assistant features including shape, size and position.

7. The method according to claim 1, wherein the assistant features are spaced apart from the main features and positioned in the middle of the shortest distance d2.

8. The method according to claim 1, wherein the assistant features abuts the main features defining the shortest distance d2.

9. The method according to claim 1, wherein each of the assistance features comprises a plurality of sub-assistant features.

10. A method for forming a layout pattern of a DRAM, comprising:
    providing an array pattern comprising a plurality of active features, wherein the active features are arranged at a same interval along a first direction to form a plurality of rows, and the active features in row n−1, row n and row n+1 are staggered along a second direction;
    defining a plurality of contact features respectively on a center portion of the active features;
    inserting a plurality of assistant features into each row of the contact features and alternating with the contact features along the first direction;

obtaining a shortest distance d1 between the contact features in row n and the contact features in row n+1 and a shortest distance d2 between the contact features in row n−1 and the contact features in row n+1;

adjusting the assistant features in row n of the contact features according to the difference between the shortest distance d1 and the shortest distance d2; and outputting the contact features and the assistant features into a photo mask.

11. The method according to claim 10, wherein the first direction and the second direction have an included angle between 70 and 75 degrees.

12. The method according to claim 10, wherein the contact features in row n−1, row n and row n+1 are not overlapped along the second direction.

13. The method according to claim 10, wherein the contact features are parallelogram-shaped, having a pair of edges parallel with the first direction and the other pair of edges parallel with the second direction.

14. The method according to claim 10, wherein each of the assistant features in the row n of the contact features is on the shortest distance d2 between the contact features in row n−1 and the contact features in row n+1.

15. The method according to claim 10, wherein the assistant features in row n are disposed between adjacent terminals of the active features in row n.

16. The method according to claim 10, wherein the step of adjusting the assistant features includes adjusting at least one of the parameters of the assistant features including shape, size and position.

17. The method according to claim 10, wherein the array pattern further comprises a plurality of word lines extending along the second direction and a plurality of bit lines extending along a third direction perpendicular to the second direction.

18. The method according to claim 17, wherein the assistant features overlaps with the word lines and disposed between two adjacent bit lines.

19. A photo mask, comprising:
an array pattern comprising a plurality of main features arranged in a same interval along a first direction to form a plurality of rows, wherein the main features in rows n−1, n and n+1 are parallel and staggered along a second direction; and
a plurality of assistant features inserted into each row of the main features, wherein each of the assistant features in row n of the main feature is on a shortest distance between the main features in row n−1 and the main features in row n+1.

20. The photo mask according to claim 19, wherein the main features in row n−1, row n and row n+1 are not overlapped along the second direction.

* * * * *